United States Patent
Watanabe et al.

(10) Patent No.: US 12,431,373 B2
(45) Date of Patent: Sep. 30, 2025

(54) TEMPERATURE CORRECTION INFORMATION CALCULATING DEVICE, SEMICONDUCTOR MANUFACTURING APPARATUS, RECORDING MEDIUM, AND TEMPERATURE CORRECTION INFORMATION CALCULATING METHOD

(71) Applicant: Tokyo Electron Limited, Tokyo (JP)

(72) Inventors: Tatsuya Watanabe, Yamanashi (JP); Yuichi Takenaga, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 705 days.

(21) Appl. No.: 17/805,952

(22) Filed: Jun. 8, 2022

(65) Prior Publication Data

US 2022/0406631 A1 Dec. 22, 2022

(30) Foreign Application Priority Data

Jun. 17, 2021 (JP) .................................. 2021-101015

(51) Int. Cl.
*H01L 21/67* (2006.01)

(52) U.S. Cl.
CPC .. *H01L 21/67248* (2013.01); *H01L 21/67103* (2013.01); *H01L 21/67253* (2013.01)

(58) Field of Classification Search
CPC ......... H01L 21/67248; H01L 21/67103; H01L 21/67253; H01L 21/67098; G05D 23/20
See application file for complete search history.

(56) References Cited

U.S. PATENT DOCUMENTS

| | | | | |
|---|---|---|---|---|
| 6,164,816 | A | * 12/2000 | Aderhold | G01J 5/0007 374/1 |
| 2007/0095799 | A1 | * 5/2007 | Matsuzawa | H01L 21/67253 438/694 |
| 2008/0213716 | A1 | * 9/2008 | Koyama | H01L 21/67248 432/120 |
| 2013/0171746 | A1 | * 7/2013 | Chang | H01L 21/67248 118/712 |
| 2020/0388496 | A1 | * 12/2020 | Lee | H01L 21/02694 |

FOREIGN PATENT DOCUMENTS

| JP | 2008-218558 | 9/2008 | |
|---|---|---|---|
| JP | 4884621 B2 | * 2/2012 | ............. C23C 14/54 |
| JP | 2013-207256 | 10/2013 | |

* cited by examiner

*Primary Examiner* — Kidest Bahta
(74) *Attorney, Agent, or Firm* — IPUSA, PLLC

(57) ABSTRACT

A temperature correction information calculating device for use with a semiconductor manufacturing apparatus is provided. The semiconductor manufacturing apparatus is configured to correct a preset temperature in accordance with an accumulated film thickness on an inner wall of the semiconductor manufacturing apparatus, control a temperature by using a heater such that the temperature approaches the corrected preset temperature, and perform a deposition process on an object. The temperature correction information calculating device includes a memory, and a processor coupled to the memory and configured to store a temperature correction value for correcting the preset temperature, obtain first heater power applied to the heater, predict second heater power by adding, to the first heater power, a variation of heater power due to a preset temperature change, and correct the temperature correction value based on the predicted second heater power. The first heater power is included in log information.

7 Claims, 17 Drawing Sheets

FIG.7

|  | ACCUMULATED FILM THICKNESS [nm] | | | | | |
|---|---|---|---|---|---|---|
|  | tk1 | tk2 | tk3 | tk4 | tk5 | tk6 |
| TEMPERATURE CORRECTION VALUE OF ZONE 1 [°C] | 0.0 | 0.1 | −0.1 | −0.1 | −0.1 | −0.2 |
| TEMPERATURE CORRECTION VALUE OF ZONE 2 [°C] | 0.0 | 0.0 | −0.1 | −0.1 | −0.2 | −0.2 |
| TEMPERATURE CORRECTION VALUE OF ZONE 3 [°C] | 0.0 | −0.1 | −0.3 | −0.3 | −0.4 | −0.3 |
| TEMPERATURE CORRECTION VALUE OF ZONE 4 [°C] | 0.0 | −0.2 | −0.3 | −0.4 | −0.5 | −0.5 |
| TEMPERATURE CORRECTION VALUE OF ZONE 5 [°C] | 0.0 | −0.3 | −0.4 | −0.4 | −0.4 | −0.3 |

| MONITORED SLOT | TEMPERATURE IN ZONE 1 IS INCREASED BY 1 °C | TEMPERATURE IN ZONE 2 IS INCREASED BY 1 °C | TEMPERATURE IN ZONE 3 IS INCREASED BY 1 °C | TEMPERATURE IN ZONE 4 IS INCREASED BY 1 °C | TEMPERATURE IN ZONE 5 IS INCREASED BY 1 °C |
|---|---|---|---|---|---|
| WAFER IN ZONE 1 | 1.01 | −0.35 | −0.12 | −0.01 | −0.03 |
| WAFER IN ZONE 2 | −0.22 | 0.88 | 0.33 | −0.02 | 0.01 |
| WAFER IN ZONE 3 | 0.03 | 0.31 | 0.70 | 0.17 | −0.07 |
| WAFER IN ZONE 4 | −0.01 | −0.14 | 0.42 | 0.94 | 0.14 |
| WAFER IN ZONE 5 | 0.01 | 0.01 | 0.12 | 0.14 | 0.79 |

FIG.8A

| | VARIATION OF FILM THICKNESS WHEN TEMPERATURE DIFFERS BY 1 °C [nm] |
|---|---|
| ZONE 1 | K |
| ZONE 2 | L |
| ZONE 3 | M |
| ZONE 4 | N |
| ZONE 5 | O |

| ZONE NAME | TEMPERATURE IN ZONE 1 IS INCREASED BY 1 °C | TEMPERATURE IN ZONE 2 IS INCREASED BY 1 °C | TEMPERATURE IN ZONE 3 IS INCREASED BY 1 °C | TEMPERATURE IN ZONE 4 IS INCREASED BY 1 °C | TEMPERATURE IN ZONE 5 IS INCREASED BY 1 °C [%] |
|---|---|---|---|---|---|
| ZONE 1 | A1 | B1 | C1 | D1 | E1 |
| ZONE 2 | A2 | B2 | C2 | D2 | E2 |
| ZONE 3 | A3 | B3 | C3 | D3 | E3 |
| ZONE 4 | A4 | B4 | C4 | D4 | E4 |
| ZONE 5 | A5 | B5 | C5 | D5 | E5 |

FIG.9B

| ZONE NAME | ACCUMULATED FILM THICKNESS [nm] | | | [%] |
|---|---|---|---|---|
| | 50 | 100 | 150 | |
| ZONE 1 | 0 | 0.03 | 0.04 | |
| ZONE 2 | 0 | 0.03 | 0.04 | |
| ZONE 3 | 0 | 0.02 | 0.04 | |
| ZONE 4 | 0 | 0.02 | 0.03 | |
| ZONE 5 | 0 | 0.03 | 0.01 | |

FIG.14A

| ZONE | TEMPERATURE IN ZONE 1 IS INCREASED BY 1°C | TEMPERATURE IN ZONE 2 IS INCREASED BY 1°C | TEMPERATURE IN ZONE 3 IS INCREASED BY 1°C | TEMPERATURE IN ZONE 4 IS INCREASED BY 1°C | TEMPERATURE IN ZONE 5 IS INCREASED BY 1°C |
|---|---|---|---|---|---|
| ZONE 1 | A1 | B1 | C1 | D1 | E1 |
| ZONE 2 | A2 | B2 | C2 | D2 | E2 |
| ZONE 3 | A3 | B3 | C3 | D3 | E3 |
| ZONE 4 | A4 | B4 | C4 | D4 | E4 |
| ZONE 5 | A5 | B5 | C5 | D5 | E5 |

↕ MULTIPLY

FIG.14B

| ZONE | ACCUMULATED FILM THICKNESS | | | |
|---|---|---|---|---|
| | 50 | 100 | 150 | |
| 1 | 0.0 | 0.1 | 0.2 | |
| 2 | 0.0 | -0.3 | -0.1 | |
| 3 | 0.0 | 0.0 | 0.1 | |
| 4 | 0.0 | 0.2 | 0.0 | |
| 5 | 0.0 | -0.1 | 0.0 | |

FIG.15A

| ZONE NAME | ACCUMULATED FILM THICKNESS [nm] | | |
|---|---|---|---|
| | 50 | 100 | 150 |
| ZONE 1 | 0 | 0.03 | 0.04 |
| ZONE 2 | 0 | 0.03 | 0.04 |
| ZONE 3 | 0 | 0.02 | 0.04 |
| ZONE 4 | 0 | 0.02 | 0.03 |
| ZONE 5 | 0 | 0.03 | 0.01 |

↑ MULTIPLY

FIG.15B

| | VARIATION OF FILM THICKNESS WHEN TEMPERATURE DIFFERS BY 1 °C [nm] |
|---|---|
| ZONE 1 | K |
| ZONE 2 | L |
| ZONE 3 | M |
| ZONE 4 | N |
| ZONE 5 | O |

TEMPERATURE CORRECTION INFORMATION CALCULATING DEVICE, SEMICONDUCTOR MANUFACTURING APPARATUS, RECORDING MEDIUM, AND TEMPERATURE CORRECTION INFORMATION CALCULATING METHOD

CROSS-REFERENCE TO RELATED APPLICATION

The present application is based on and claims priority to Japanese Priority Application No. 2021-101015 filed on Jun. 17, 2021, the entire contents of which are incorporated herein by reference.

BACKGROUND OF THE INVENTION

1. Field of the Invention

The present disclosure relates to a temperature correction information calculating device, a semiconductor manufacturing apparatus, a recording medium, and a temperature correction information calculating method.

2. Description of the Related Art

In a process for manufacturing semiconductor devices, a heat treatment system configured to perform processes such as a deposition process on a semiconductor wafer is known. In the heat treatment system, various processing conditions such as a preset temperature, pressure, and a gas flow rate, as controlled by a semiconductor manufacturing apparatus, are determined in a process recipe of a process. The semiconductor manufacturing apparatus repeatedly performs heat treatment in order to deposit a film on a semiconductor wafer. At this time, deposits adhere to the inner wall surface of the semiconductor manufacturing apparatus. If the accumulated film thickness of deposits increases, the furnace temperature decreases even if the semiconductor manufacturing apparatus controls the furnace temperature at a preset temperature. Thus, a film having a desired film thickness cannot be deposited on the semiconductor wafer.

A heat treatment system that corrects a preset temperature in accordance with an accumulated film thickness is known (see Patent Document 1, for example). Patent Document 1 discloses a technique that generates temperature correction information in which an accumulated film thickness is associated with the amount of correcting a preset temperature.

RELATED-ART DOCUMENTS

Patent Documents

Patent Document 1: Japanese Laid-open Patent Publication No. 2008-218558

SUMMARY OF THE INVENTION

According to the present disclosure, it is desirable to provide a technique capable of adjusting a preset temperature of heat treatment on an object.

According to the present disclosure, a temperature correction information calculating device for use with a semiconductor manufacturing apparatus is provided. The semiconductor manufacturing apparatus is configured to correct a preset temperature in accordance with an accumulated film thickness on an inner wall of the semiconductor manufacturing apparatus, control a temperature by using a heater such that the temperature approaches the corrected preset temperature, and perform a deposition process on an object. The temperature correction information calculating device includes a memory, and a processor coupled to the memory and configured to store a temperature correction value for correcting the preset temperature, obtain first heater power applied to the heater, predict second heater power by adding, to the first heater power, a variation of heater power due to a preset temperature change, and correct the temperature correction value based on the predicted second heater power. The first heater power is included in log information that is generated when the deposition process is performed.

BRIEF DESCRIPTION OF THE DRAWINGS

Other objects and further features of the present invention will be apparent from the following detailed description when read in conjunction with the accompanying drawings, in which:

FIG. 7 is an example of a temperature correction table;

FIG. 8A and FIG. 8B are tables schematically illustrating models stored in a model storage;

FIG. 9A and FIG. 9B are tables schematically illustrating a temperature versus power table and an accumulated film thickness versus power table stored in a table storage;

FIG. 14A and FIG. 14B are tables illustrating a method of calculating (i) a variation of heater power due to a change in a present temperature value;

FIG. 15A and FIG. 15B are tables illustrating a method of calculating (ii) a variation of heater power due to a change in an accumulated film thickness;

DETAILED DESCRIPTION OF THE EMBODIMENTS

According to an embodiment of the present invention, a technique capable of adjusting a preset temperature of heat treatment on an object can be provided.

Hereinafter, non-limiting exemplary embodiments of the present disclosure will be described. A heat treatment system and a temperature correction information calculating method performed by the heat treatment system according to embodiments of the present disclosure will be described with reference to the accompanying drawings.

[Outline of Temperature Correction in Accordance with Accumulated Film Thickness]

The heat treatment system performs multiple times of deposition processes in one cycle. Further, in the deposition processes, the heat treatment system uses a temperature correction table to correct a preset temperature defined in a process recipe. When a temperature correction table is generated, heater power recorded in a log is taken into account. However, for the heater power, the log is obtained from a given deposition process in one cycle (the log can be selected by a user, but a log of the first deposition process is mainly selected). Therefore, there would be a possibility that heater power in the second and subsequent deposition processes would be different from the heater power in the first deposition process. If the temperature during film deposition is corrected based on a temperature correction table, which is corrected based on heater power that is different from the actual heater power, a target film thickness would not be obtained.

In light of the above, the heat treatment system according to an embodiment can accurately correct a temperature correction table by predicting heater power in the second and subsequent deposition processes from heater power in the first deposition process, in order to obtain a film thickness close to a target film thickness.

In the following, details will be described.

[Overall Configuration of Heat Treatment System that Includes Semiconductor Manufacturing Apparatuses]

Figure 1:
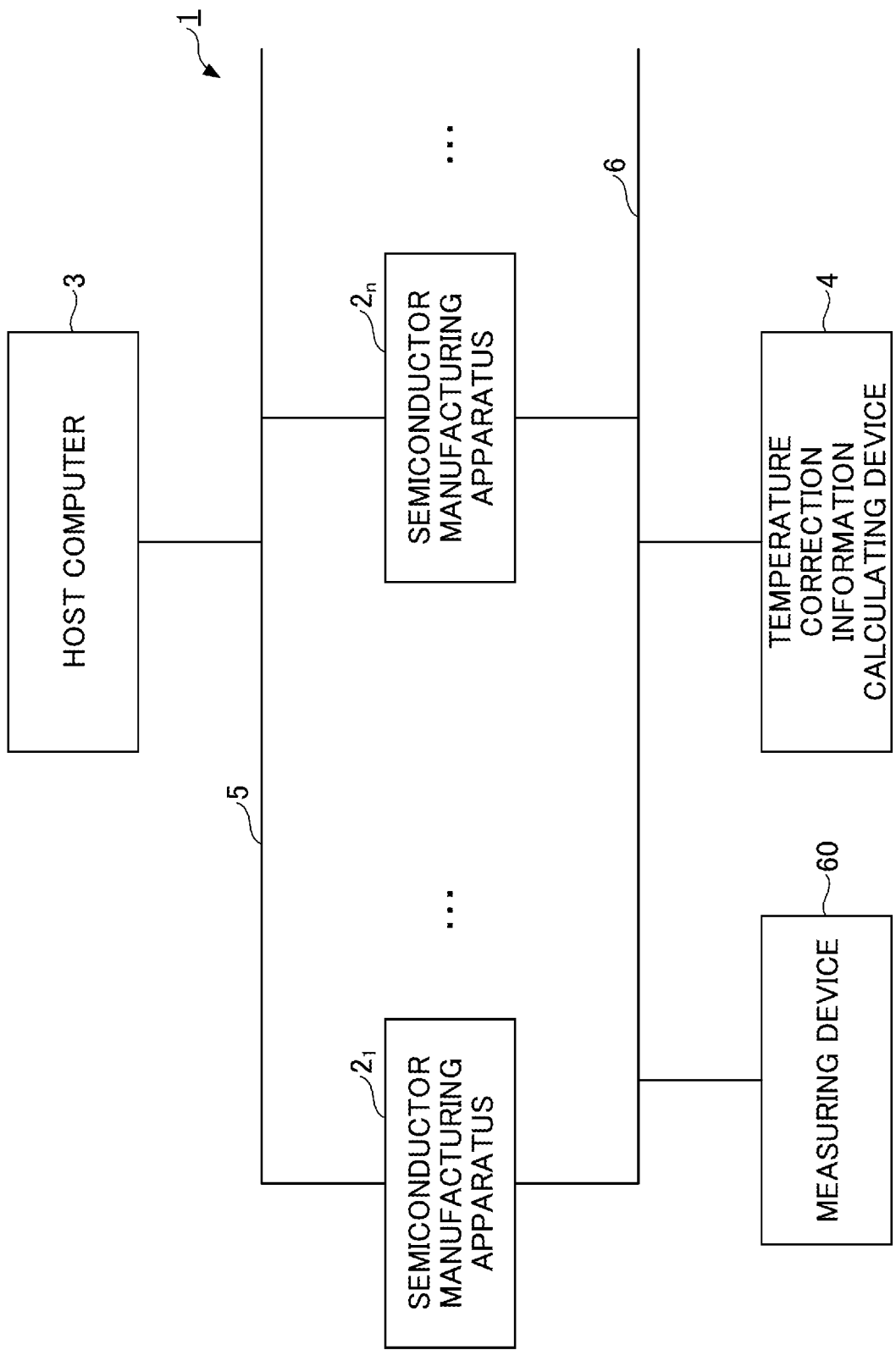
FIG. 1 is a diagram illustrating a schematic configuration of an example of a heat treatment system.

FIG. 1 is a diagram illustrating a schematic configuration of an example of a heat treatment system. As illustrated in FIG. 1, a heat treatment system 1 according to an embodiment includes a plurality of semiconductor manufacturing apparatuses 2 (semiconductor manufacturing apparatuses 21 to 2n in FIG. 1), a host computer 3, a temperature correction information calculating device 4, and networks 5 and 6. The above components are connected with one another via the networks 5 and 6. In addition, the heat treatment system 1 includes a measuring device 60 configured to measure the state (such as the state of a film) of an object (hereinafter referred to as a "semiconductor wafer") treated by each of the semiconductor manufacturing apparatuses 2.

Figure 2:
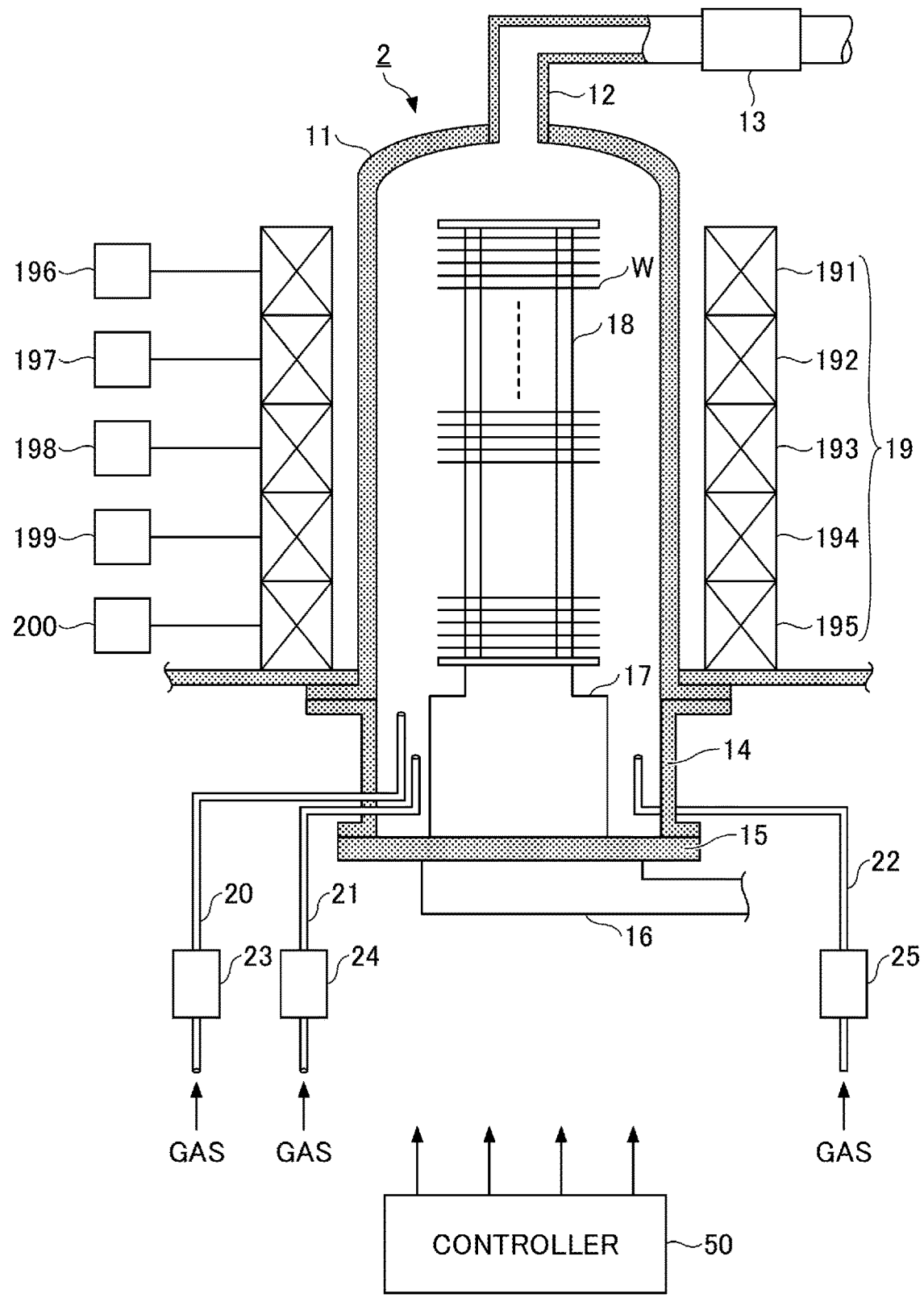
FIG. 2 is a schematic cross-sectional view of an example of a semiconductor manufacturing apparatus.

The semiconductor manufacturing apparatuses 2 may include various kinds of apparatuses in accordance with processes. For example, the semiconductor manufacturing apparatuses 2 may include a deposition apparatus configured to form a thin film on a semiconductor wafer, an oxidation apparatus configured to perform an oxidizing process for oxidizing a surface region of a semiconductor wafer, and a diffusion apparatus configured to diffuse (dope) impurities into a surface region of a semiconductor wafer. In the following, as an example of a semiconductor manufacturing apparatus, a batch-type vertical heat treatment apparatus as illustrated in FIG. 2 will be described. Further, in the present embodiment, a deposition process will be described as a process performed on a semiconductor wafer.

FIG. 2 is a schematic cross-sectional view of an example of a semiconductor manufacturing apparatus 2. As illustrated in FIG. 2, the semiconductor manufacturing apparatus 2 includes a reaction tube 11 having an approximately cylindrical shape. The reaction tube 11 is disposed such that the longitudinal direction of the reaction tube 11 is in the vertical direction. The reaction tube 11 may be formed of a material having excellent heat resistance and corrosion resistance, such as quartz.

An exhaust pipe 12 for exhausting gases in the reaction tube 11 is airtightly connected to the upper side of the reaction tube 11. The exhaust pipe 12 is provided with a pressure regulator 13 including a valve and a vacuum pump. The pressure regulator 13 regulates the interior of the reaction tube 11 to be at a desired pressure (a degree of vacuum).

A manifold 14 having an approximately cylindrical shape is disposed at the lower side of the reaction tube 11. The upper end of the manifold 14 is airtightly joined to the lower end of the reaction tube 11.

A cover 15 is disposed under the manifold (the reaction tube 11). The cover 15 is configured to be vertically movable by a boat elevator 16. With this configuration, when the cover 15 is lifted by the boat elevator 16, a bottom end portion (a furnace port) of the manifold (the reaction vessel 11) is closed, and when the cover 15 is lowered by the boat elevator 16, the bottom end portion (the furnace port) of the reaction tube 11 is opened.

A wafer boat 18 is installed on a heat insulating tube (a heat insulator) 17, over the cover 15. The wafer boat 18 is a wafer holding device that accommodates (holds) an object such as a semiconductor wafer W. In the present embodiment, the wafer boat 18 is configured to accommodate a plurality of semiconductor wafers W (for example, 150 semiconductor wafers W) at predetermined intervals in the vertical direction. In order to load the semiconductor wafers W into the reaction tube 11, the semiconductor wafers W are accommodated in the wafer boat 18 and the cover 15 is lifted by the boat elevator 16.

A heater 19, composed of, for example, a resistance heating element, is disposed around the reaction tube 11. The interior of the reaction tube 11 is heated to a predetermined temperature by a heater 19, and as a result, the semiconductor wafers W are heated to a predetermined temperature.

Figure 3:
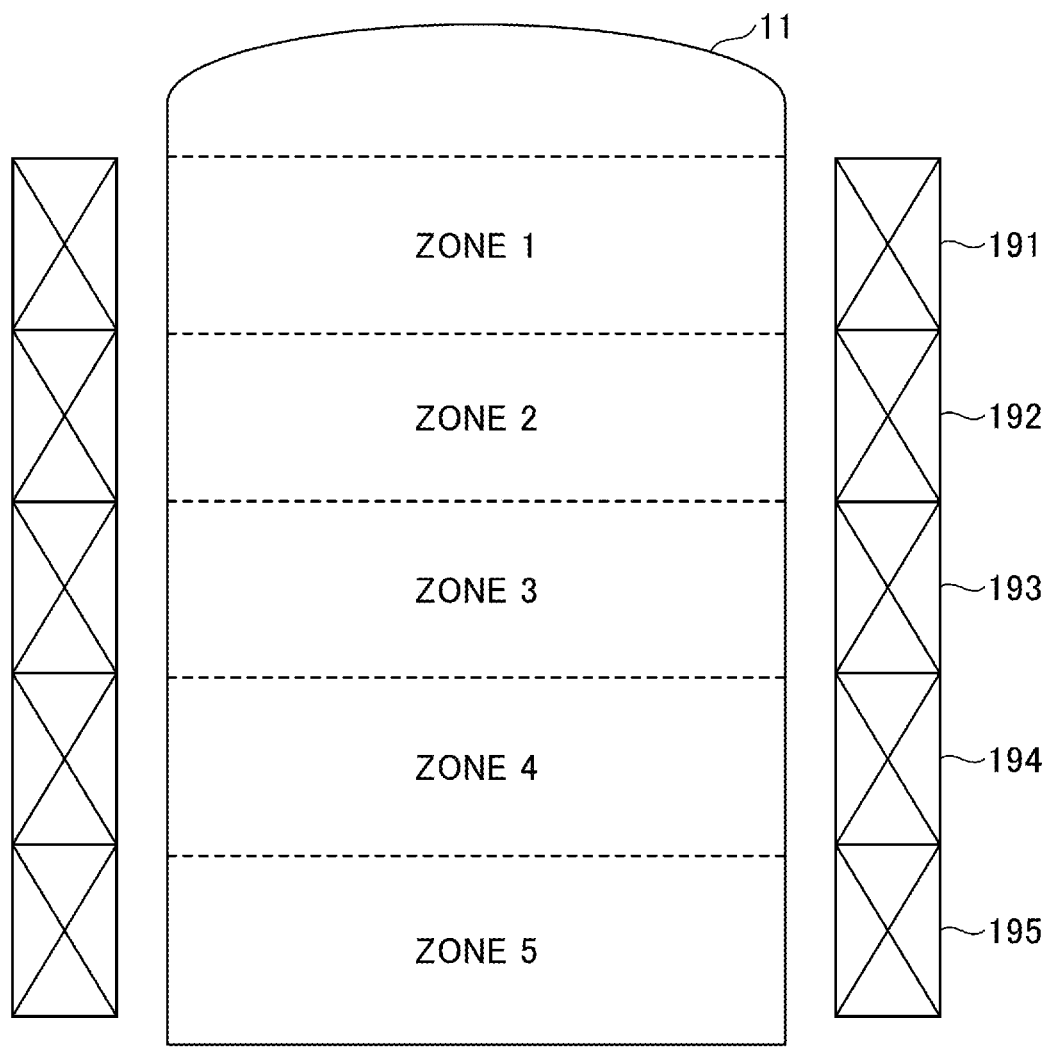
FIG. 3 is a diagram illustrating an example of divided zones.

The heater 19 includes heaters 191 to 195, arranged in, for example, five stages. The heaters 191 to 195 are independently supplied with electric power and thus independently controlled by respective power controllers 196 to 200. In this manner, the interior of the reaction tube 11 is divided into five zones (zones 1 to 5) by the heaters 191 to 195, as illustrated in FIG. 3. Note that the number of zones is not limited to five. The interior of the reaction tube 11 may be divided into two or more zones, or is not necessarily divided into zones.

The manifold 14 is provided with a plurality of gas supply pipes for supplying gases into the reaction tube 11. In the present embodiment, three gas supply pipes 20 to 22 are provided. A raw material gas for film deposition and a carrier gas are supplied into the gas supply pipes 20 to 22 via flow rate regulators 23 to 25. Each of the rate regulators 23 to 25 is configured by a mass flow controller (MFC) or the like for regulating a gas flow rate.

Five temperature sensors (thermocouples) (not illustrated) are arranged on the inner wall of the reaction tube 11 in a line in the vertical direction. Each of the temperature sensors is covered by a quartz pipe or the like in order to prevent metal contamination of the semiconductor wafers W, and is arranged in a corresponding zone illustrated in FIG. 3.

The semiconductor manufacturing apparatus 2 includes a controller 50 configured to control processing parameters, such as the temperature of a treatment atmosphere, a gas flow rate, and the pressure in the reaction tube 11. The controller 50 receives signals output from the temperature sensors, pressure sensors, and the like (not illustrated), and outputs control signals to the power controllers 196 to 200 of the heaters 191 to 195, the pressure regulator 13, and the flow rate regulators 23 to 25.

[Hardware Configuration of Controller]

Figure 4:
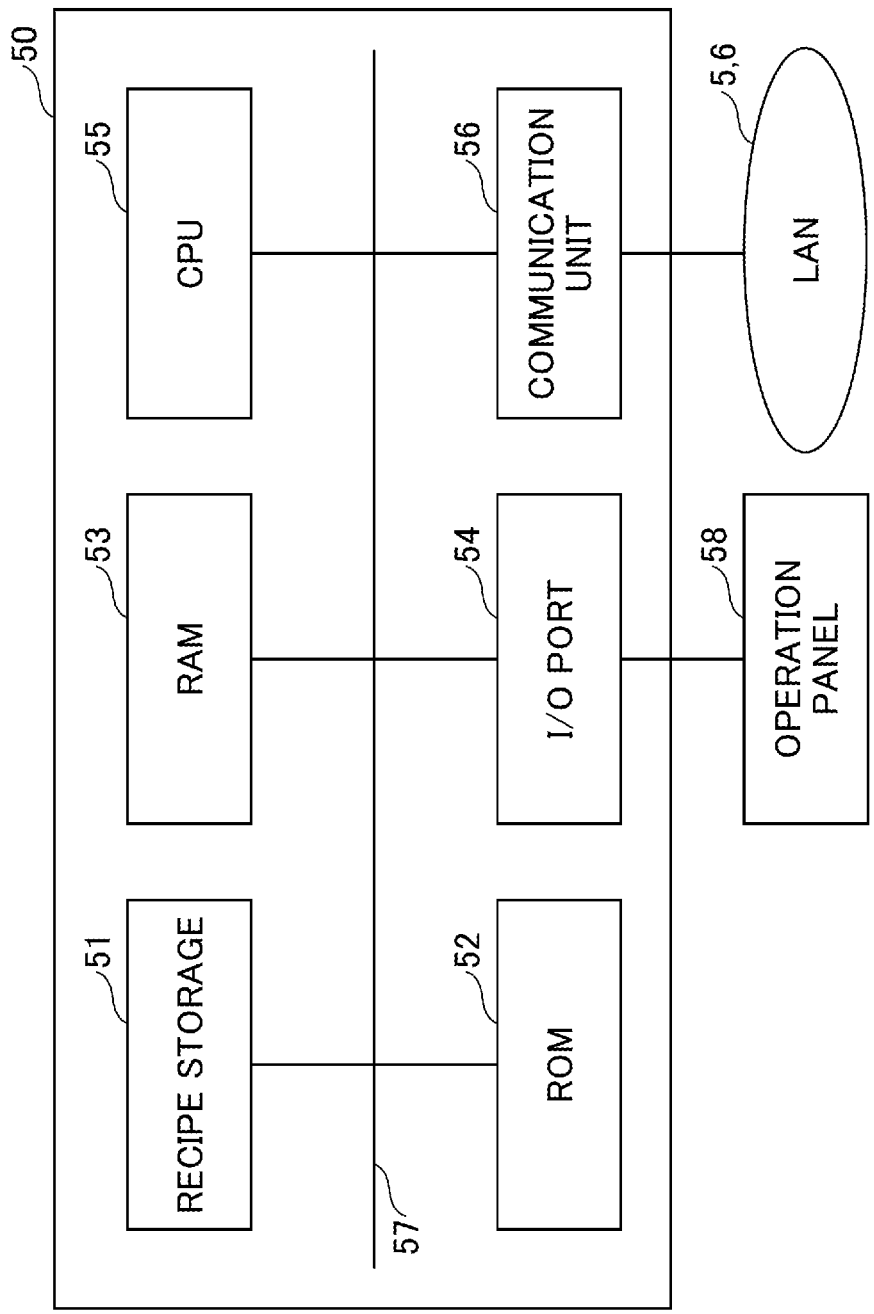
FIG. 4 is a diagram illustrating an example configuration of a controller.

FIG. 4 is a diagram illustrating an example configuration of the controller 50. The controller 50 includes a recipe storage 51, a read-only memory (ROM) 52, a random-access memory (RAM) 53, an input/output (I/O) port 54, a central processing unit (CPU) 55, a communication unit 56, and a bus 57. The above components are connected to one another via the bus 57.

The recipe storage 51 stores a process recipe that defines a control procedure in accordance with the type of a deposition process performed by the semiconductor manufacturing apparatus 2. The process recipe is treatment information that is prepared for each treatment (process) actually performed by an operator, and that defines a temperature change of each element, a pressure change in the reaction tube 11, timings at which to start and stop supplying a gas, the amount of the gas to be supplied, and the like, during a period of time from loading the semiconductor wafers W into the reaction tube 11 to unloading the treated semiconductor wafers W. With the process recipe, a preset film thickness for heat treatment, a preset temperature of each apparatus, and the like can be specified. In the case of a usual batch-type heat treatment apparatus, a single process recipe is prepared for all semiconductor wafers W. However, in the present embodiment, a predetermined process recipe is prepared for each of the zones illustrated in FIG. 3, such that the treatment results of the semiconductor wafers W are made uniform.

Further, the process recipe includes an optimized value calculating recipe. The optimized value calculating recipe is used to correct a preset temperature of each apparatus to be an optimal temperature (an optimized value) based on a temperature correction table, and set the corrected temperature as a preset temperature. Therefore, when the semiconductor manufacturing apparatus 2 performs heat treatment based on the optimized value calculating recipe, optimized values of preset temperatures of zones 1 to 5 are calculated, and the calculated optimized values are set as preset temperatures.

As described, preset temperatures are corrected by the semiconductor manufacturing apparatus 2. However, the temperature correction information calculating device 4 may provide the semiconductor manufacturing apparatus 2 with a process recipe in which preset temperatures are corrected based on a temperature correction table. Alternatively, preset temperatures may be corrected by any apparatus, as long as the semiconductor manufacturing apparatus 2 can execute a process recipe at the correct preset temperatures.

The ROM 52 is configured by an EEPROM, a flash memory, a hard disk, or the like, and serves as a recording medium that stores an operation program of the CPU 55 and the like.

The RAM 53 functions as a work area for the CPU 55. For example, the RAM 53 stores the number of process executions by the semiconductor manufacturing apparatus 2. The accumulated film thickness of deposits adhering to the interior of the semiconductor manufacturing apparatus 2 can be identified based on the number of process executions and a preset film thickness stored in the recipe storage 51.

The I/O port 54 sends measurement signals related to a temperature, pressure, and a gas flow rate to the CPU 55, and outputs control signals, which are output from the CPU 55, to respective elements (the power controllers 196 to 200, the flow rate regulators 23 to 25, and the pressure regulator 13). An operation panel 58, by which the operator operates the semiconductor manufacturing apparatus 2, is connected with the I/O port 54.

The CPU 55 constitutes a main part of the controller 50. The CPU 55 is configured to execute the operation program stored in the ROM 52 so as to control the operation of the semiconductor manufacturing apparatus 2 based on the process recipe stored in the recipe storage 51, in accordance with an instruction from the operation panel 58.

The communication unit 56 is configured to perform communication between the semiconductor manufacturing apparatus 2, the host computer 3, and the temperature correction information calculating device 4 via LANs 5 and 6. The bus 57 transmits information between the elements.

The host computer 3 is an apparatus configured to control the entire semiconductor manufacturing apparatus 2, and perform a process for instructing the semiconductor manufacturing apparatus 2 to perform heat treatment or the like. Note that the host computer 3 has a known configuration (not illustrated).

[Example Hardware Configuration of Temperature Correction Information Calculating Device]

Figure 5:
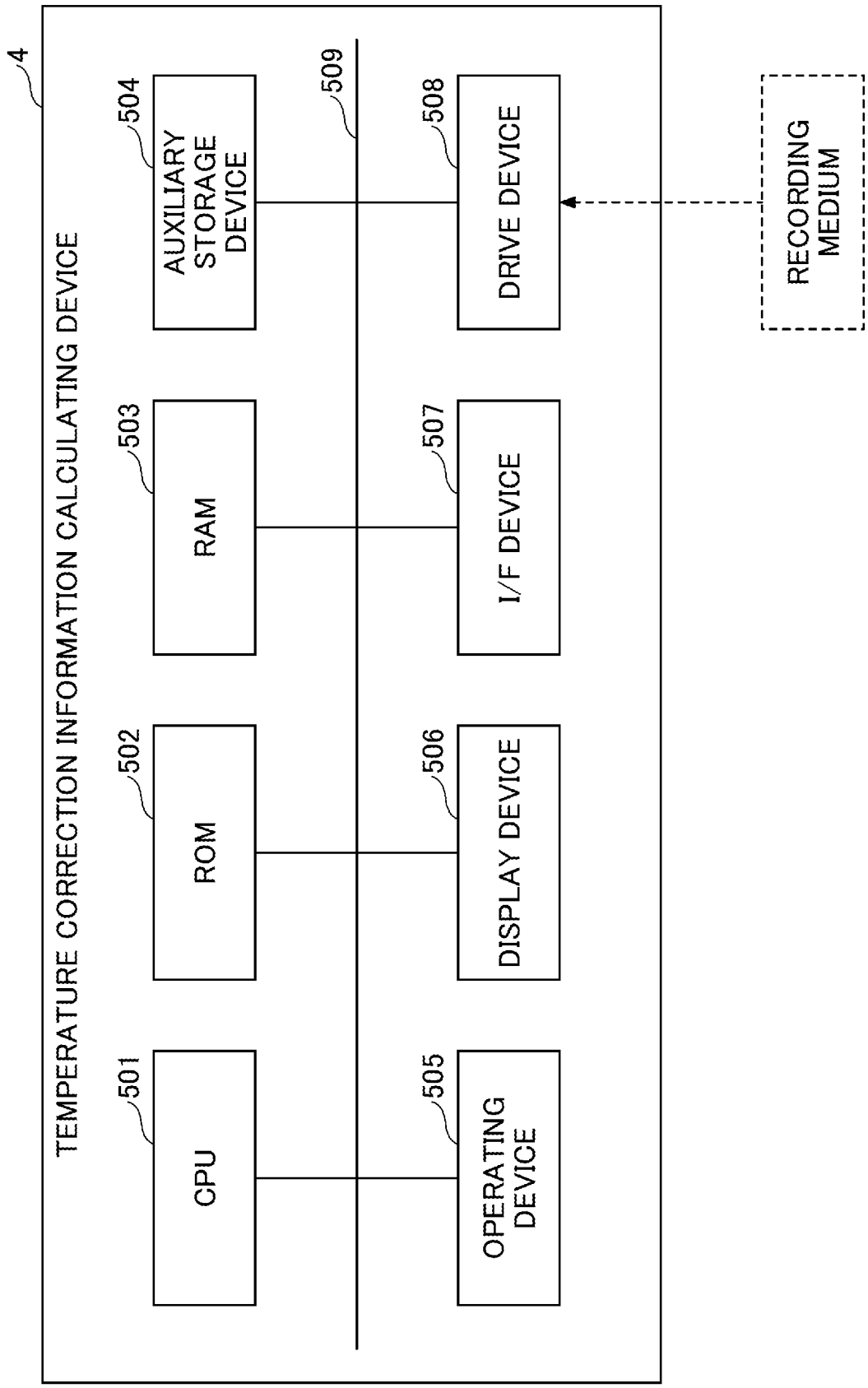
FIG. 5 is a diagram illustrating an example hardware configuration of a temperature correction information calculating device.

FIG. 5 is a diagram illustrating an example hardware configuration of the temperature correction information calculating device. The temperature correction information calculating device 4 performs a process for generating a temperature correction table in accordance with accumulated film thicknesses (the number of film depositions) in order to reduce a difference between the temperature in the furnace and a preset temperature, which is caused by the influence of an accumulated film thickness in the semiconductor manufacturing apparatus 2.

The temperature correction information calculating device 4 includes a CPU 501, a ROM 502, and a RAM 503. The CPU 501, the ROM 502, and the RAM 503 form what is called a computer. Further, the temperature correction information calculating device 4 includes an auxiliary storage device 504, an operating device 505, a display device 506, an interface (I/F) device 507, and a drive device 508. The hardware components of the temperature correction information calculating device 4 are interconnected to one another via a bus 509.

The CPU 501 executes various programs installed in the auxiliary storage device 504.

The ROM 502 is a non-volatile memory that functions as a main storage device. The ROM 502 stores various programs, data, and the like that are necessary for the CPU 501 to execute the various programs installed in the auxiliary storage device 504.

The RAM 503 is a volatile memory such as a dynamic random-access memory (DRAM) or a static random-access memory (SRAM) and functions as a main storage device. The RAM 503 provides a workspace in which the various programs installed in the auxiliary storage device 504 are deployed when the various programs are executed by the CPU 501.

The auxiliary storage device 504 is a non-volatile large-capacity storage device that stores various programs. The auxiliary storage device 504 may be a non-volatile large-capacity storage device such as a hard disk drive (HDD) or a solid-state drive (SSD).

The operating device 505 is an input device used when an administrator inputs various instructions into the temperature correction information calculating device 4. The display device 506 is a display device that displays internal information of the temperature correction information calculating device 4 and information obtained from external devices.

The I/F device 507 is a connection device for connecting to the LAN 6 and communicating with the controller 50 of the semiconductor manufacturing apparatus 2. The I/F device 507 also communicates with the measuring device 60 and the host computer 3.

The drive device 508 is a device in which a recording medium is set. The recording medium may be a medium that records information optically, electrically, or magnetically, such as a CD-ROM, a flexible disk, or a magneto-optical disk. The recording medium may be a semiconductor memory that electrically records information, such as a ROM, or a flash memory, or the like.

Various programs to be installed in the auxiliary storage device 504 are installed when, for example, a distributed recording medium is set in the drive device 508 and various programs recorded in the recording medium are read by the drive device 508. Alternatively, various programs to be installed in the auxiliary storage device 504 may be downloaded from a predetermined server and installed in the auxiliary storage device 504.

[Functions of Temperature Correction Information Calculating Device]

Figure 6:
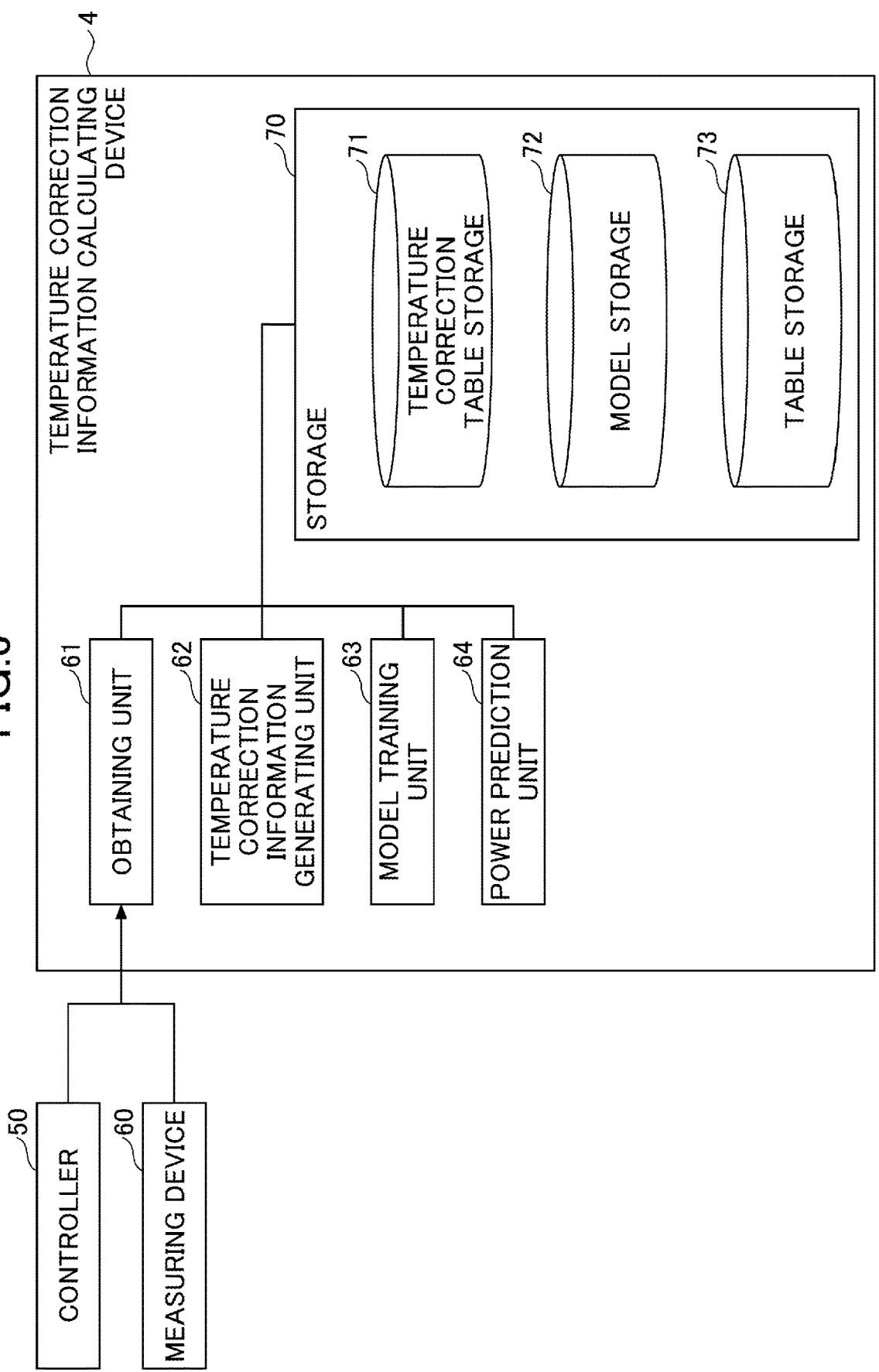
FIG. 6 is a functional block diagram illustrating an example functional configuration of the temperature correction information calculating device.

Next, referring to FIG. 6, information retained by the temperature correction information calculating device 4 and a functional configuration of the temperature correction information calculating device 4 will be described. FIG. 6 is a functional block diagram illustrating an example functional configuration of the temperature correction information calculating device 4.

The temperature correction information calculating device 4 includes an obtaining unit 61, a temperature correction information generating unit 62, a model training unit 63, and a power prediction unit 64. The functions of the temperature correction information calculating device 4 are implemented by the CPU 501 illustrated in FIG. 5 executing a program loaded from the auxiliary storage device 504 into the RAM 503.

The obtaining unit 61 obtains, from the controller 50 of the semiconductor manufacturing apparatus 2, log information related to heat treatment on the semiconductor wafers W performed based on the process recipe. The log information includes preset temperatures, heater power, and the like in time series. The obtaining unit 61 obtains heater power applied to the heaters, which is included in log information that is generated when a deposition process is performed. Further, the obtaining unit 61 can obtain monitored film thicknesses of monitored semiconductor wafers W from the measuring device 60. The number of process executions by the semiconductor manufacturing apparatus 2 can be identified by log information. Therefore, the accumulated film thickness of deposits adhering to the interior of the semiconductor manufacturing apparatus 2 can be identified based on the number of process executions and a preset film thickness stored in the process recipe.

The temperature correction information generating unit 62 uses models, which will be described later, to obtain a relationship between preset temperatures included in log information and monitored film thicknesses measured by the measuring device 60, to create a temperature correction table. Further, the temperature correction information generating unit 62 corrects temperature correction values in the temperature correction table such that heater power is not saturated (0% or 100%).

The model training unit 63 updates models stored in a model storage 72. Updating models means changing models based on deposition results and a target film thickness, such that the models more accurately represent the relationship between preset temperatures and film thicknesses in the semiconductor manufacturing apparatus 2. The term "updating" may be referred to as "training". In the present embodiment, updating models may be referred to as training models. In the present embodiment, training of models is not a characteristic part of the present invention, and thus, is not described in detail.

The power prediction unit 64 predicts heater power in the second and subsequent deposition processes based on heater power recorded in log information of the first deposition process in one cycle. Many users tend to select log information of the first deposition process in one cycle; however, the log information of the first deposition process in one cycle is not necessarily selected. A temperature versus power table and a temperature correction table are used to predict heater power. In addition, an accumulated film thickness versus power table and variations of accumulated film thicknesses may be further used to predict heater power.

Further, the temperature correction information calculating device 4 includes a storage 70 configured by the RAM 503 or the auxiliary storage device 504. The storage 70 includes a temperature correction table storage 71, the model storage 72, and a table storage 73.

FIG. 7 is an example of a temperature correction table. The temperature correction table represents the relationship between the accumulated film thicknesses of deposits adhering to the interior of the semiconductor manufacturing apparatus 2 and temperature correction values, on a per-predetermined-temperature basis (on a per-preset-temperature basis) in the semiconductor manufacturing apparatus 2. In the temperature correction table of FIG. 7, the temperatures in the semiconductor manufacturing apparatus 2 are set to be predetermined temperatures, and temperature correction values used when deposits having predetermined accumulated film thicknesses adhere to the interior of the semiconductor manufacturing apparatus 2 are associated with the zones.

In the example of FIG. 7, a film thickness of tk1 [nm] is formed on a semiconductor wafer at the initial state before the process recipe is executed. For example, tk1 may be 100 [nm]; however, tk1 may vary depending on the process recipe. The process recipe includes six deposition processes. The six deposition processes are performed in one cycle of heat treatment. In one deposition process, a predetermined film thickness $\Delta tk$ is formed. An accumulated film thickness increases, e.g., tk2=tk1+$\Delta tk$, tk3=tk2+$\Delta tk$, . . . , and a film thickness of tk6+$\Delta tk$ can be obtained in the sixth deposition process. Note that the number of deposition processes included in one cycle of heat treatment may be any number, and a film thickness formed in one deposition process may vary depending on the process recipe.

In a case where the semiconductor manufacturing apparatus 2 corrects a preset temperature of zone 1 with an accumulated film thickness being tk2 [nm], the semiconductor manufacturing apparatus 2 calculates the "preset temperature included in the process recipe+0.1" ° C. as a corrected preset temperature.

Note that, if any preset temperature and any accumulated film thickness differ from values defined in the temperature correction table, the semiconductor manufacturing apparatus 2 may perform interpolation for adjustment.

Further, the temperature correction table is an example of information that stores the temperature correction values for correcting preset temperatures. The storage format of the temperature correction values is not limited to a table format. For example, the temperature correction table may be expressed in a function format or in a graph format.

FIG. 8A and FIG. 8B are tables schematically illustrating models stored in the model storage 72. Models are prepared on a per preset-temperature basis. In the example of FIG. 8A and FIG. 8B, models prepared for given preset temperatures are depicted. As used herein, the term "model" refers to data created by studying the relationship between preset temperatures and changes in power beforehand and used to control the semiconductor manufacturing apparatus 2.

A model illustrated in FIG. 8A represents temperature variations in a given slot when the temperature in each of the zones is increased by 1° C. Specifically, when the temperature in a given zone is changed, the temperatures in the other zones are also changed. As described, there may be a case where the temperatures of semiconductor wafers are not equal to preset temperatures due to a temperature distribution in the reaction tube 11 or the like. The actual temperatures of the semiconductor wafers W when the preset temperatures of the zones differ by 1° C. are calculated based on the model illustrated in FIG. 8A.

In a model illustrated in FIG. 8B, a variation of a film thickness when the temperature differs by 1° C. is defined for each of the zones. That is, a variation of a temperature is associated with a variation of a film thickness. For a semiconductor wafer W, a film thickness is formed in accordance with the actual temperature of the semiconductor wafer W during heat treatment (when other parameters such as a gas type and pressure are assumed to be constant) and the heat treatment time. The model illustrated in FIG. 8B represents a correspondence between the actual temperature and a film thickness of a semiconductor wafer W according to various findings. For example, when the temperature in zone 1 differs by 1° C. (this temperature is corrected based on the model illustrated in FIG. 8A), a variation of a film thickness is K [nm].

An example of using the model illustrated in FIG. 8B to generate a temperature correction table of zone 1 will be described. An evaluation function as described below is used to generate a temperature correction table.

Evaluation function $J=f$(residual difference from a target film thickness, a model representing variations of temperatures and film thicknesses, temperature variations)

As the model representing variations of temperatures and film thicknesses, a model representing "preset temperatures vs deposition amounts" can be obtained by referring to the model representing "preset temperatures vs wafer temperatures" illustrated in FIG. 8A and the model representing "wafer temperatures and deposition amounts" in FIG. 8B. Then, optimized values are obtained by finding a combination of temperature variations that minimizes the evaluation function J in the range that satisfies constraint conditions. The constraint conditions include a condition that heater power is not saturated and a condition that a temperature limitation range specified by a user is not exceeded.

As described, a temperature correction table is generated by referring to the two models illustrated in FIG. 8A and FIG. 8B. Therefore, the two models are desired to be accurate to the extent possible. For this reason, the temperature correction information calculating device 4 has a function to train the models. The model training unit 63 updates (trains) the models based on differences between monitored film thicknesses and target film thicknesses. As a concept, as the differences between the monitored film thicknesses, which serve as deposition results, and the target film thicknesses increase, the model training unit 63 increases the variations of the temperatures of the semiconductor wafers W when the temperatures differ by 1° C. in FIG. 8A, and increases the variations of the film thicknesses when the temperatures differ by 1° C. in FIG. 8B.

More specifically, the model training unit 63 updates the two modes by applying the differences between the monitored film thicknesses and the target film thicknesses to an extended Kalman filter or the like. A method of updating the models is not a characteristic part of the present invention, and is not thus described in detail. In the following, the two models illustrated in FIG. 8A and FIG. 8B are included in any model, unless otherwise specified.

Note that each of the models is an example of information that stores variations of the temperatures of the semiconductor wafers W with respect to variations of preset temperatures, or stores variations of film thicknesses with respect to variations of preset temperatures. The storage format of the information is not limited to a table format. For example, a model may be expressed in a function format or in a graph format.

FIG. 9A illustrates an example of a temperature versus power table stored in the table storage 73. The temperature versus power table is also one of models. The temperature versus power table is used to calculate variations of heater power due to changes in preset temperatures. As illustrated in FIG. 9A, variations of heater power required to change the temperature in each of the zones by 1° C. are set. That is, the variations of the temperatures are associated with the variations of heater power. The actual values may vary; however, as an example, the actual values may be percentages (%) on the order of one tenth or one thousandth.

FIG. 9B illustrates an example of an accumulated film thicknesses versus power table stored in the table storage 73. The accumulated film thicknesses versus power table is used to calculate variations of heater power due to changes in accumulated film thicknesses. The accumulated film thicknesses versus power table illustrated in FIG. 9B represents the amount of power that changes when the heat transfer changes due to an increase in the accumulated film thickness of deposits on the wall surface of the chamber. That is, variations of the accumulated film thickness are associated with variations of heater power. As the accumulated film thickness increases, heater power tends to be saturated, and the output value of the heater power indicates a similar tendency. That is, the slope of variations of heater power changes in accordance with the accumulated film thickness. Details will be described later. Note that the values in FIG. 9B are merely examples for description.

Note that the temperature versus power table and the accumulated film thicknesses versus power table are examples of information that stores variations of heater power. The storage format of the information is not limited to a table format. For example, each of the temperature versus power table and the accumulated film thicknesses versus power table may be expressed in a function format or in a graph format.

[Overview of Temperature Correction Function in Accordance with Accumulated Film Thickness]

Figure 10:
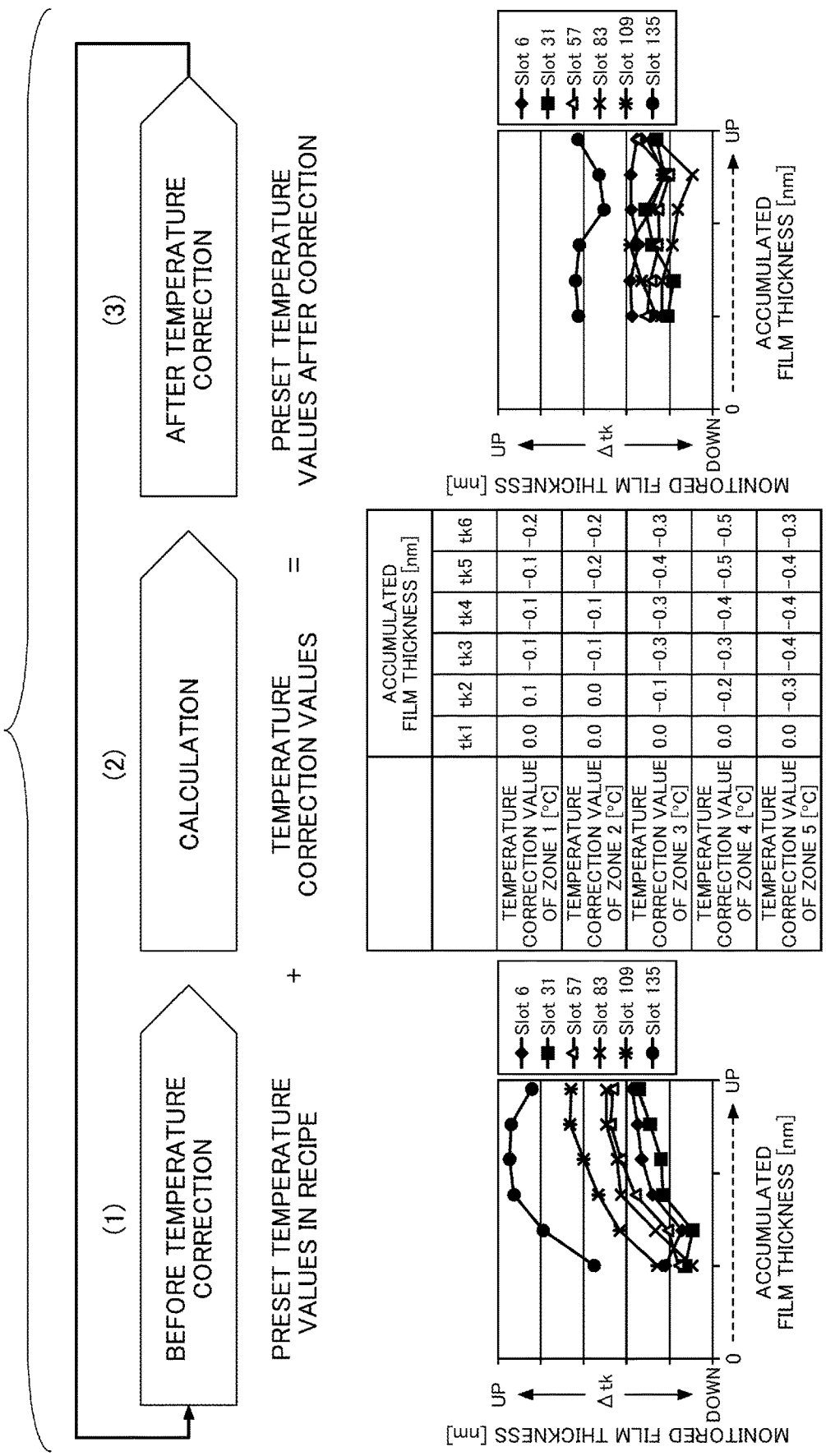
FIG. 10 is a diagram illustrating example deposition results obtained by using a temperature correction table to correct temperatures in accordance with accumulated film thicknesses, and performing deposition processes.

FIG. 10 is a diagram illustrating example deposition results obtained by using a temperature correction table to correct temperatures in accordance with accumulated film thicknesses, and performing deposition processes.

(1) First, the semiconductor manufacturing apparatus 2 performs heat treatment based on a temperature correction table before correction, which corresponds to heat treatment "before temperature correction" depicted in FIG. 10. The heat treatment "before temperature correction" refers to the initial heat treatment (including six deposition processes). A film thickness formed in one deposition process is denoted as Δtk [nm]. As illustrated in FIG. 10, each deposition process is performed with the aim of depositing a film having a thickness of Δtk [nm] on a semiconductor wafer W; however, the thickness of the film deviates from the target thickness Δtk [nm] as the accumulated film thickness on the wall surface of the chamber increases.

In a left graph of FIG. 10, the horizontal axis indicates an accumulated film thickness, and the vertical axis indicates a monitored film thickness. The monitored film thickness varies around Δtk. In FIG. 10, the six deposition processes are performed in one cycle. The graph indicates a monitored film thickness formed in one deposition process with respect to an accumulated film thickness accumulated in the six deposition processes. Specifically, a plurality of curves in the graph of FIG. 10 represent monitored film thicknesses of semiconductor wafers W arranged at different locations in the vertical direction on the wafer boat 18. The gas concentration varies depending on the vertical location in the reaction tube 11. Therefore, semiconductor wafers W arranged at different locations are extracted beforehand in order to monitor the film thicknesses of the semiconductor wafers W. The semiconductor wafers W whose film thicknesses are monitored and measured are semiconductor wafers W disposed in respective zones.

As the number of deposition processes increases, the accumulated film thickness on the inner wall surface of the semiconductor manufacturing apparatus increases. If the accumulated film thickness increases, the furnace temperature decreases even when the furnace temperature is controlled at the same processing temperature. In such a case, a thin film having a desired film thickness would not be formed on a semiconductor wafer W. As illustrated in the left graph of FIG. 10, as the accumulated film thickness increases, the monitored film thickness tends to gradually increase.

(2) The temperature correction information generating unit 62 generates a temperature correction table illustrated in FIG. 10, by using the models illustrated in FIG. 8 to obtain a relationship between preset temperatures included in log information and the monitored film thicknesses obtained from the measuring device 60. The generation of the temperature correction table immediately after the initial heat treatment is referred to as the first calculation process. The generation of the temperature correction table corresponds to a "calculation" process depicted in FIG. 10. In the second and subsequent calculation processes after the temperature correction table is generated, the models may be updated by user settings or automatic determination. The automatic determination means that, if the results, obtained based on the temperature correction table calculated in the first calculation process, are not improved, it is determined that the accuracy of the models is poor, and thus the models are updated in the second and subsequent calculation processes so that film thicknesses approach the target thicknesses. Further, the models may be automatically updated in response to the detection of disturbance or the like.

Note that past calculation data is used to update (train) the models. Therefore, the models are not updated in the first calculation process since there is no past calculation data in the initial heat treatment.

(3) The semiconductor manufacturing apparatus 2 performs heat treatment based on the temperature correction table, which corresponds to heat treatment "after temperature correction" depicted in FIG. 10. A right graph of FIG. 10 depicts deposition results of deposition processes performed based on the temperature correction table in which the preset temperatures are corrected. In FIG. 10, after the temperature correction, even when accumulated film thicknesses increase, monitored film thicknesses tend to be stable.

[Generating Temperature Correction Table]

Figure 11:
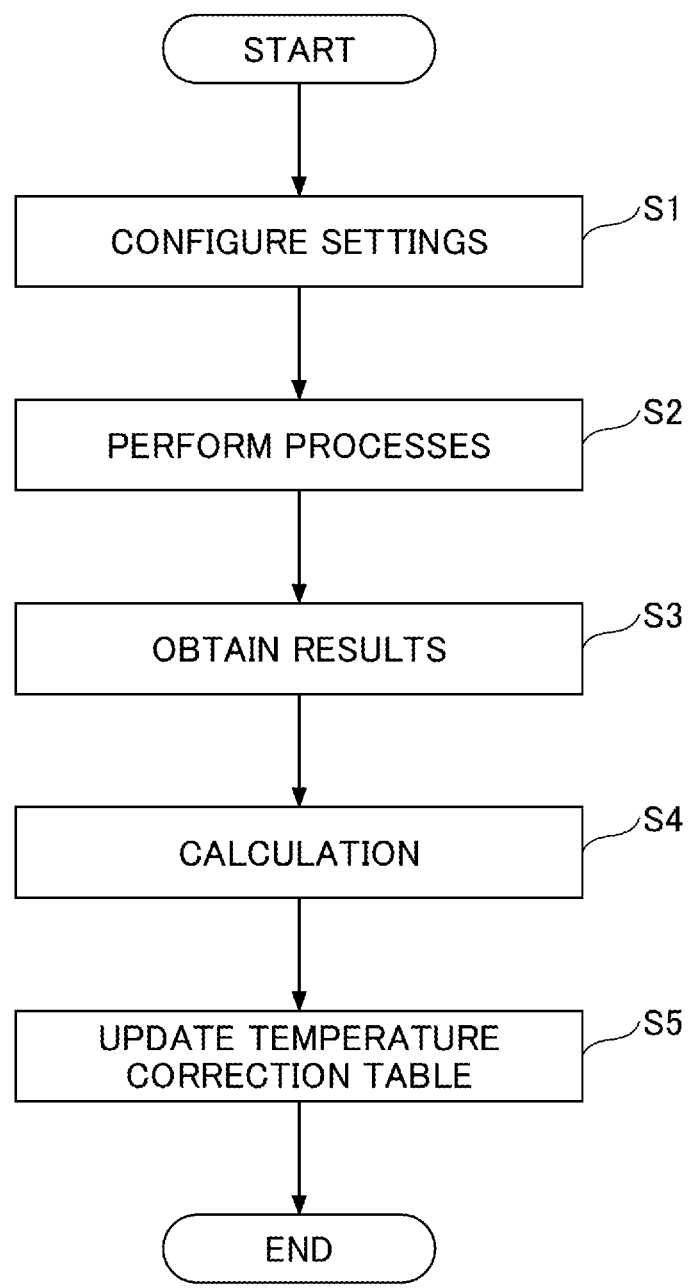
FIG. 11 is a flowchart illustrating an example of a process performed by a temperature correction information generating unit to generate a temperature correction table.

FIG. 11 is a flowchart illustrating an example of a process performed by the temperature correction information generating unit 62 to generate a temperature correction table.

First, before starting deposition processes, a user creates a process recipe (configuring preset temperature values and the like) for performing the deposition processes (step S1). At this time, a temperature correction table is not optimized yet, and thus, the user can set any values as the preset temperature values. Instead of the user, the temperature correction information generating unit 62 may set predetermined initial values as the preset temperature values.

The semiconductor manufacturing apparatus 2 uses the process recipe created in step S1 and the temperature correction table to perform one cycle of deposition processes (up to 20 deposition processes) (step S2).

The measuring device 60 measures film thicknesses formed in each of the deposition processes in one cycle (step S3). After one cycle, if the reproducibility of the film thicknesses satisfies a predetermined criterion, the process ends. If the criterion is not satisfied, the process proceeds to step S4.

The temperature correction information generating unit 62 calculates optimized values of the temperature correction table by using a log of a given deposition process, selected by the user from the deposition processes performed in step S2, the measurement results obtained in step S3, the values of the temperature correction table used in the deposition processes, and the models (step S4). Further, in step S4, based on heater power and a "model representing power variations due to changes in temperatures by 1° C. (the temperature versus power table)", the temperature correction information generating unit 62 corrects the temperature correction table in the range that does not saturate the heater power. Details will be described with reference to FIG. 12.

The temperature correction information generating unit 62 updates the values of the temperature correction table to the optimized values calculated in step S4 (step S5).

The temperature correction information calculating device 4 repeats steps S2 to S5, which includes performing deposition processes, calculating optimized values, and updating the temperature correction table, until the reproducibility of desired film thicknesses is obtained.

[Inconvenience Caused by Saturation of Heater Power]

The role of heater power in updating the temperature correction table, and also inconvenience that may be caused when the temperature correction table is corrected by using heater power selected by the user in step S2 will be described.

Figure 12:
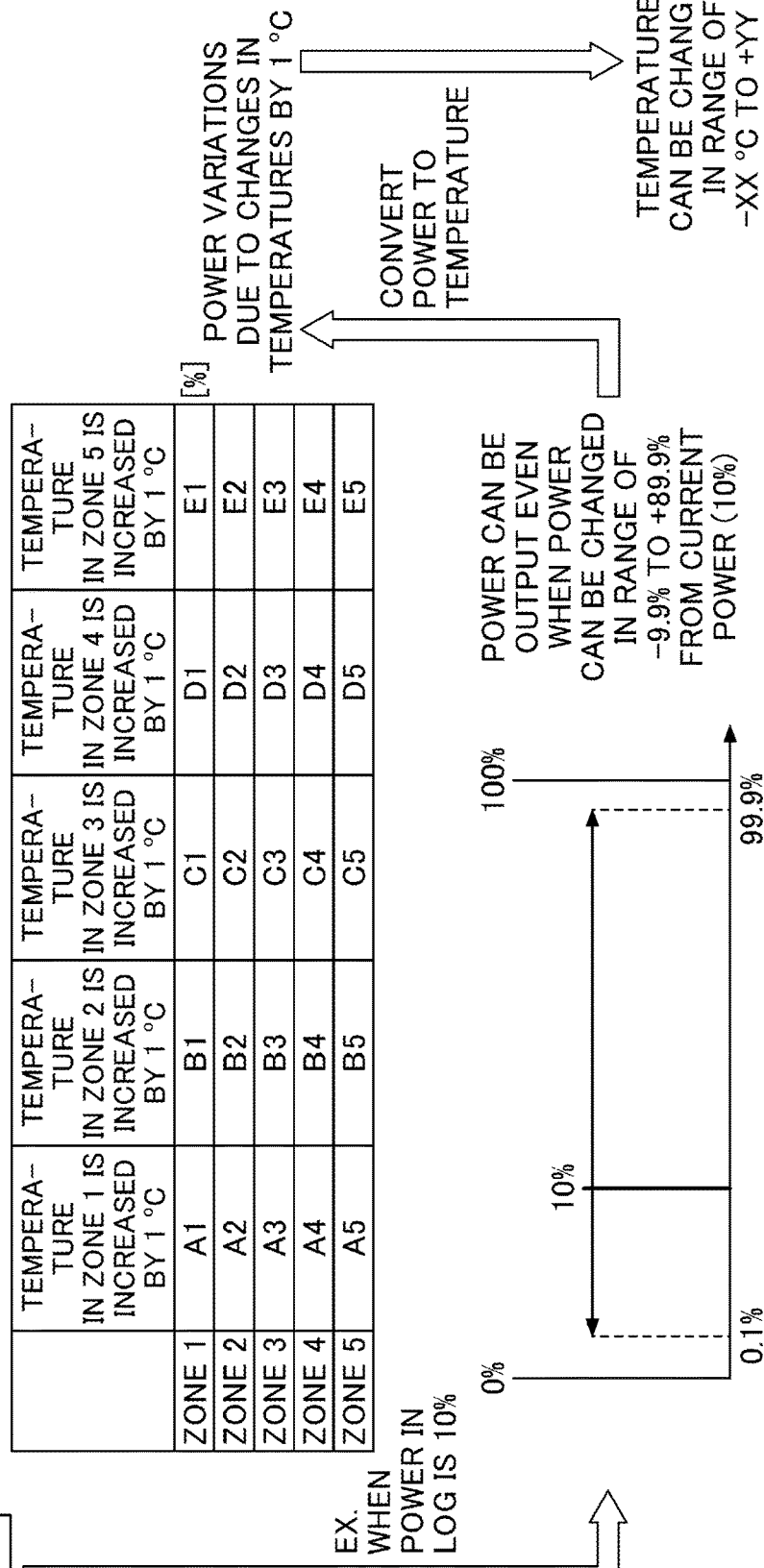
FIG. 12 is a diagram illustrating the role of heater power in updating the temperature correction table.

FIG. 12 is a diagram illustrating the role of heater power in updating the temperature correction table. As in step S2 of FIG. 11, when the semiconductor manufacturing apparatus 2 performs deposition processes, logs of power output states (heater power) are recorded. In a comparison technique (for example, the conventional technique), a user selects a log of the first deposition process in one cycle, and inputs heater power in the log into a temperature correction information calculating device 4 (software). In the conventional technique, heater power in the subsequent deposition processes in one cycle is assumed to be the same as heater power recorded in the selected log of the first deposition process.

In the present embodiment, when calculating optimized values in step S4 of FIG. 11, the temperature correction information generating unit 62 determines the upper and lower limits of the percentage by which heater power can vary from the value recorded in the log. For example, if the heater power recorded in the log is 10%, the lower limit is 0.1%, and the upper limit is 99.9%. Note that 0.1% on both the upper and lower limit sides is an offset.

Next, the temperature correction information generating unit 62 determines a range in which temperature values can vary by combining the determined "power variation range" and the "model representing power variations due to changes in temperatures by 1° C. (the temperature versus power table)". If the heater power read from the log is 100%, the temperature correction information generating unit 62 changes the temperatures such that the heater power decreases. Conversely, if the heater power is 0%, the temperature correction information generating unit 62 changes the temperatures such that the heater power increases. That is, the temperature correction information generating unit 62 corrects the temperature correction table based on the heater power predicted by the power prediction unit 64. As described, if the heater power is saturated, the temperatures are changed accordingly.

However, as in the comparison technique, if heater power is assumed to be the same in all deposition processes in one cycle, the following inconvenience would occur.

If heater power recorded in a log of a selected deposition process is "1%", heater power in other deposition processes in one cycle is assumed to be "1%". The heater power is not saturated even when the heater power is changed in a range of "−0.9% to +98.9%" in all the deposition processes in one cycle. However, there may be a case where the heater power in any deposition process other than the selected deposition process is actually "0.5%". In this case, the lowest value by which the heater power can be decreased is "0.4%", but there may be a possibility that the heater power may be decreased by "0.9%". If the deposition processes are performed by using correction values that cause the heater power of "0.5%" to be decreased by "0.9%", the heater power would be saturated. Thus, improvement effects would not be obtained.

In view of the above, in the present embodiment, the temperature correction information generating unit 62 predicts heater power in each deposition process to generate a temperature correction table.

Note that a user can select logs of all deposition processes in one cycle, but the usability would decrease. The temperature correction information generating unit 62 (software) can automatically select logs of all deposition processes in one cycle, but there would be a possibility that the logs would be mistakenly selected. In such a case, the user would be required to check (or correct in some cases) the automatically selected logs of one cycle.

[Predicting Heater Power]

Figure 13:
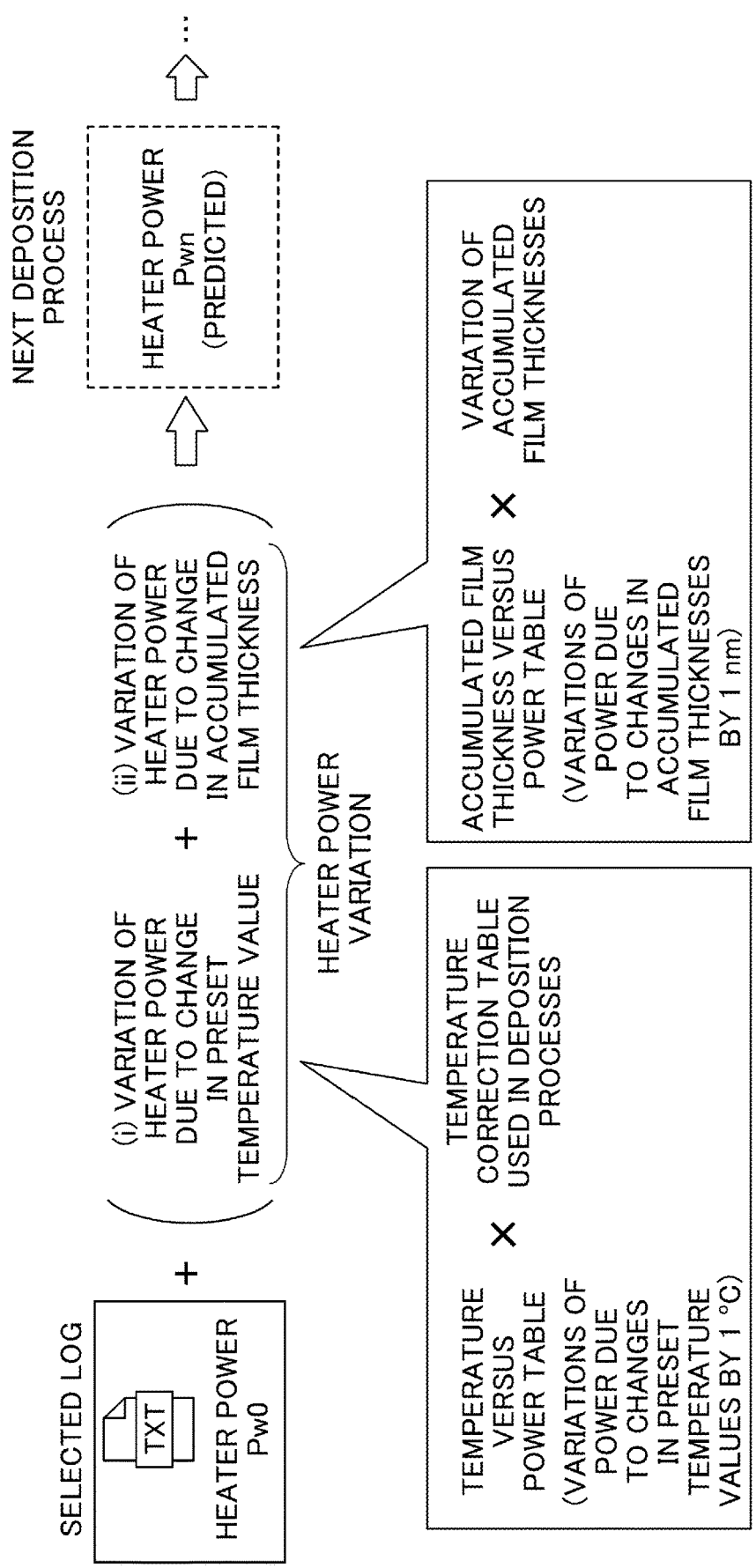
FIG. 13 is a diagram schematically illustrating a method of predicting heater power.

FIG. 13 is a diagram schematically illustrating a method of predicting heater power. Based on heater power (hereinafter referred to as "Pw0", which is an example of "first heater power") included in a log of a deposition process selected by the user from among deposition processes in one cycle (for example, a log of the first deposition process), the power prediction unit 64 predicts heater power (hereinafter referred to as "Pwn", where n=2 (up to 20)) in the next deposition process. The heater power "Pwn" is an example of second heater power.

$$Pwn = Pw0 + (i) + (ii) \quad (1)$$

where (i) denotes a variation of heater power due to a change in a present temperature value, and (ii) denotes a variation of heater power due to a change in an accumulated film thickness. The above (i) is calculated based on the temperature versus power table and a temperature correction table used in the deposition processes. The above (ii) is calculated based on the accumulated film thickness versus power table and a variation of an accumulated film thickness.

FIG. 14A and FIG. 14B are tables illustrating a method of calculating (i) a variation of heater power due to a change in present temperature value. FIG. 14A depicts a temperature versus power table, and FIG. 14B depicts a temperature correction table. For each of the zones, values, representing heater power variations, in a column of the temperature versus power table are each multiplied by a corresponding temperature correction value in the temperature correction table. For example, in the case of zone 4 and an accumulated film thickness of 100 [nm], values in a column of zone 4 of the temperature versus power table are multiplied by a temperature correction value of the zone 4 in the temperature correction table as follows:

$$D1 \cdot 0.2, D2 \cdot 0.2, D3 \cdot 0.2, D4 \cdot 0.2, D5 \cdot 0.2$$

For zones 1 to 3 and zone 5, values are calculated in the same manner. Next, the power prediction unit 64 adds values, which are obtained by multiplying values, in the row direction of the temperature correction table. In this manner, a variation of heater power in each of the zones is calculated. For example, a variation of heater power due to a change in a preset temperature value for each of zones 1 to 5 is as follows.

a variation of heater power due to a change in a preset temperature value (zone 1)=$A1 \cdot 0.1 + B1 \cdot (-0.3) + C1 \cdot (0.0) + D1 \cdot 0.2 + E1 \cdot (-0.1)$ \hfill (i)

a variation of heater power due to a change in a preset temperature value (zone 2)=$A2 \cdot 0.1 + B2 \cdot (-0.3) + C2 \cdot (0.0) + D2 \cdot 0.2 + E2 \cdot (-0.1)$ \hfill (i)

a variation of heater power due to a change in a preset temperature value (zone 3)=$A3 \cdot 0.1 + B3 \cdot (-0.3) + C3 \cdot (0.0) + D3 \cdot 0.2 + E3 \cdot (-0.1)$ \hfill (i)

a variation of heater power due to a change in a preset temperature value (zone 4)=$A4 \cdot 0.1 + B4 \cdot (-0.3) + C4 \cdot (0.0) + D4 \cdot 0.2 + E4 \cdot (-0.1)$ \hfill (i)

a variation of heater power due to a change in a preset temperature value (zone 5)=$A5 \cdot 0.1 + B5 \cdot (-0.3) + C5 \cdot (0.0) + D5 \cdot 0.2 + E5 \cdot (-0.1)$ \hfill (i)

Note that, when (i) is calculated, a temperature versus power table I, which is used in deposition processes in the first cycle, is used. That is, the temperature correction table I is a temperature correction table before optimized values are calculated.

A temperature correction table II is obtained by calculating optimized values based on information such as the temperature correction table I used to calculate (i), deposition results, and heater power obtained from a log of a disposition process. The temperature correction table II is used in deposition processes in the next cycle.

That is, the power prediction unit 64 uses the old temperature correction table I to predict heater power, and the temperature correction information generating unit 62 generates the new temperature correction table II.

FIG. 15A and FIG. 15B are tables illustrating a method of calculating (ii) a variation of heater power due to a change in an accumulated film thickness. FIG. 15A depicts an accumulated film thickness versus power table. FIG. 15B depicts a variation of a film thickness when the temperature differs by 1° C. for each of the zones (FIG. 15B is the same as FIG. 8B). A variation of heater power in each of the zones is obtained by multiplying a value in FIG. 15A by a value in FIG. 15B. For example, if an accumulated film thickness is 100 [nm], a variation of heater power in each of zones 1 to 5 is calculated as follows.

a variation of heater power due to a change in an accumulated film thickness in zone $1=0.03 \cdot K$ (ii)

a variation of heater power due to a change in an accumulated film thickness in zone $2=0.03 \cdot L$ (ii)

a variation of heater power due to a change in an accumulated film thickness in zone $3=0.02 \cdot M$ (ii)

a variation of heater power due to a change in an accumulated film thickness in zone $4=0.02 \cdot N$ (ii)

a variation of heater power due to a change in an accumulated film thickness in zone $5=0.03 O$ (ii)

Note that, in FIG. 15A and FIG. 15B, a variation of power in accordance with an accumulated film thickness is multiplied by a variation of a film thickness due to a temperature change. However, it is considered that "(ii) a variation of heater power due to a change in an accumulated film thickness" tends to be saturated as the accumulated film thickness increases. Therefore, a relationship satisfying "power variation=f(accumulated film thickness)" may be obtained beforehand, and a variation of heater power due to a change in an accumulated film thickness may be interpolated based on the relationship at the time of prediction.

Further, a variation of a film thickness when the temperature differs by 1° C. as illustrated in FIG. 15B may be set for each accumulated film thickness. Further, the term (ii) in the equation (1) has little effect on heater power, and thus, the term (ii) in the equation (1) is not necessarily used for prediction of heater power.

[Operation Process]

Figure 16:
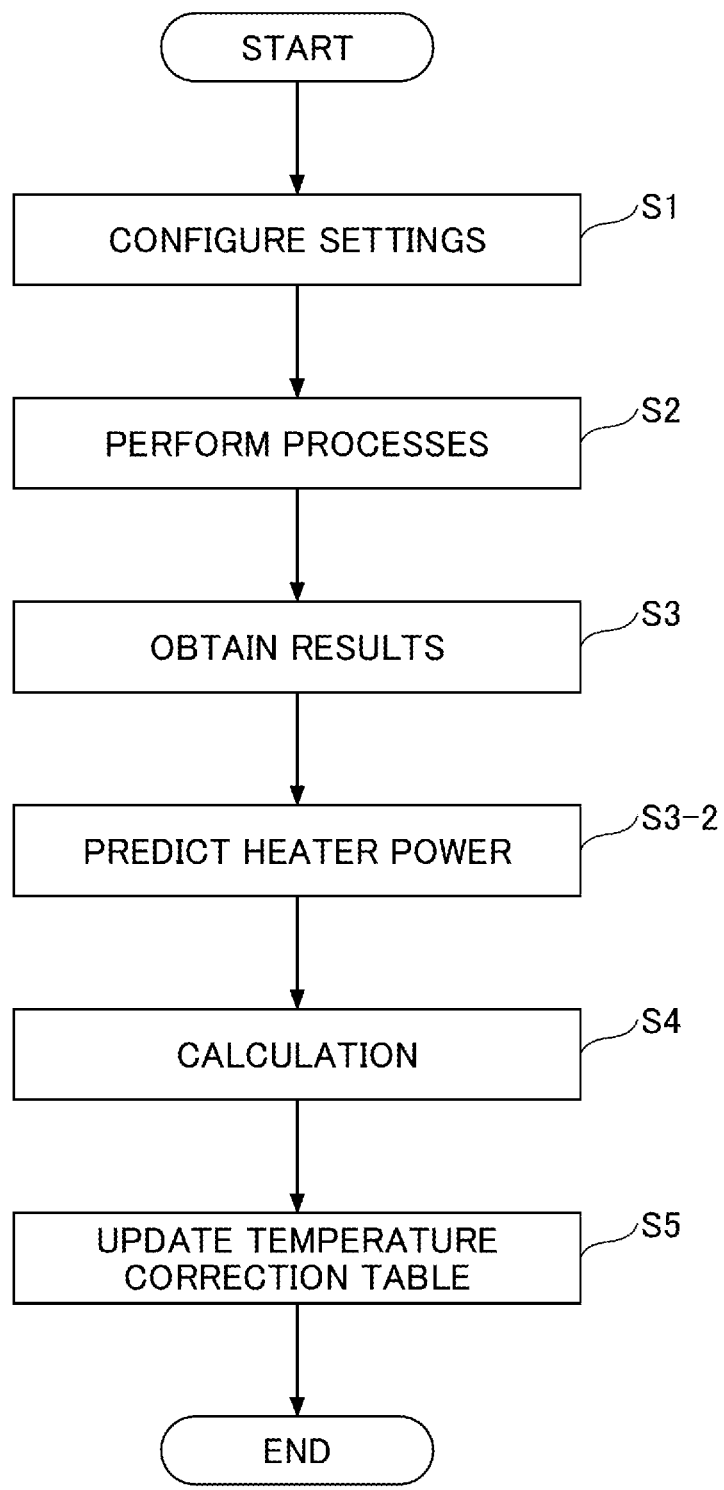
FIG. 16 is a flowchart illustrating an example of a process performed by the temperature correction information generating unit to generate a temperature correction table.

FIG. 16 is a flowchart illustrating an example of a process performed by the temperature correction information generating unit 62 to generate a temperature correction table. In FIG. 16, differences from FIG. 11 will be mainly described. Steps S1 to S3 in FIG. 16 are the same as those in FIG. 11.

In step S3, if the reproducibility of film thicknesses does not satisfy the predetermined criterion after one cycle, the process proceeds to step S3-2.

In step S3-2, the power prediction unit 64 uses the temperature versus power table and the temperature correction table used in the deposition processes to calculate (i) a variation of heater power based on a change in a preset temperature value. Further, the power prediction unit 64 uses the accumulated film thickness versus power table and a variation of a film thickness (FIG. 15B) to calculate (ii) a variation of heater power based on a change in an accumulated film thickness. The power prediction unit 64 adds (i) and (ii) to the heater power Pw0 included in the log of the given deposition process, selected by the user in step S2. Then, the power prediction unit 64 predicts heater power in deposition processes other than the selected deposition process (for example, if a deposition process with an accumulated film thickness of 0 [nm] is selected, the power prediction unit 64 predicts heater power in deposition processes with accumulated film thicknesses of 50 and 100 [nm]).

In step S4, as described in FIG. 12, the temperature correction information generating unit 62 determines a range in which temperature values can vary by combining the determined "power variation range" and the "model representing power variations due to changes in temperatures by 1° C. (the temperature versus power table)". If the predicted heater power is 100%, the temperature correction information generating unit 62 changes the temperature correction values of the temperature correction table such that the heater power decreases. Conversely, if the predicted heater power is 0%, the temperature correction information generating unit 62 changes the temperature correction values of the temperature correction table such that the heater power increases.

Accordingly, the temperature correction information calculating device 4 according to the embodiment can use predicted heater power to correct a temperature correction table, instead of using heater power in a deposition process selected by a user. Therefore, the accuracy of temperature control when deposition processes are performed can be improved.

[Effects Obtained by Temperature Correction Information Calculating Device According to Embodiment]

Figure 17:
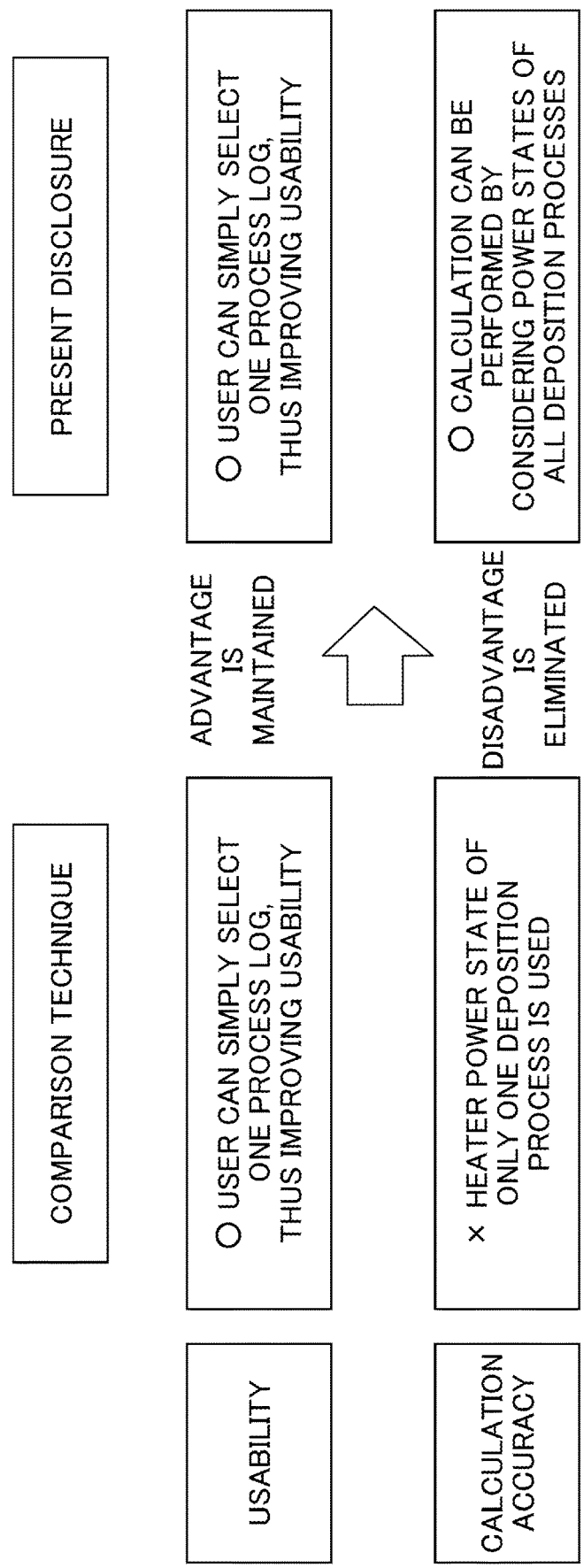
FIG. 17 is a diagram illustrating effects obtained by predicting heater power.

FIG. 17 is a diagram illustrating effects obtained by predicting heater power as described in the embodiment above.

(1) Usability

First, in the comparison technique, the user can select a log of one deposition process from deposition processes in one cycle. Thus, improved usability can be provided. In the present embodiment, the advantage of providing improved usability can be maintained.

(2) Calculation Accuracy

In the comparison technique, heater power in one deposition process in one cycle is considered as heater power in all deposition processes. Thus, the calculation accuracy of a temperature correction table would be reduced. Conversely, in the present embodiment, heater power is predicted in all deposition processes in one cycle. Accordingly, the calculation accuracy of a temperature correction table can be improved.

[Main Effects]

As described above, the heat treatment system according to the embodiment can predict heater power for each deposition process in one cycle. Therefore, when heater power is saturated, the heat treatment system according to the embodiment can correct a temperature correction table so that the heater power is not saturated. Accordingly, the semiconductor manufacturing apparatus 2 can perform a deposition process while controlling the temperature, thus making it possible to easily obtain a target film thickness.

[Other Configurations]

In the present embodiment, the temperature correction information calculating device 4 illustrated in FIG. 1 trains models and generates a temperature correction table. However, the semiconductor manufacturing apparatus 2 may include the functions of the temperature correction information calculating device 4.

Further, the temperature correction information calculating device 4 may be a server connected to a network. The semiconductor manufacturing apparatus 2 can communicate with the temperature correction information calculating device 4 to obtain a temperature correction table. The temperature correction information calculating device 4 may reside on the Internet or may reside on-premises.

The heat treatment system 1 illustrated in FIG. 1 is an example, and it is apparent that there are various system configuration examples depending on the application and purpose. A device division such as the host computer 3, the semiconductor manufacturing apparatus 2, the measuring device 60, and the temperature correction information calculating device 4 in FIG. 1 is an example.

For example, the heat treatment system 1 may have various configurations, such as an integrated configuration of at least two of the host computer 3, the semiconductor manufacturing apparatus 2, the measuring device 60, and the temperature correction information calculating device 4, or a further divided configuration. For example, the temperature correction information calculating device 4 may be provided for each semiconductor manufacturing apparatus 2.

The semiconductor manufacturing apparatus 2 disclosed herein is not limited to a batch-type apparatus, and may be a single-wafer deposition apparatus that processes a single substrate at a time or may be a semi-batch-type apparatus.

A process performed by the semiconductor manufacturing apparatus is not limited to a deposition process. The semiconductor manufacturing apparatus may be used as an oxidation apparatus for performing an oxidizing process for oxidizing a surface region of a semiconductor wafer, a diffusion apparatus for diffusing (doping) impurities into a surface region of a semiconductor wafer, an annealing apparatus, or an etching apparatus.

The semiconductor manufacturing apparatus 2 disclosed herein may be an apparatus configured to utilize a plasma to treat a substrate.

What is claimed is:

1. A system comprising:
a semiconductor manufacturing apparatus; and
a temperature correction information calculating device for use with the semiconductor manufacturing apparatus,
the semiconductor manufacturing apparatus including:
a first memory; and
a first processor coupled to the first memory and configured to
correct a preset temperature in accordance with an accumulated film thickness on an inner wall of the semiconductor manufacturing apparatus,
control a temperature by using a heater such that the temperature approaches the corrected preset temperature in the semiconductor manufacturing apparatus, and
perform a deposition process on an object, and
the temperature correction information calculating device including:
a second memory; and
a second processor coupled to the second memory and configured to
store a temperature correction value for correcting the preset temperature,
obtain first heater power applied to the heater, the first heater power being included in log information that is generated when the deposition process is performed,
predict second heater power by adding, to the first heater power, a first variation of heater power due to a preset temperature change and a second variation of heater power due to an accumulated film thickness change, and
correct the temperature correction value based on the predicted second heater power, wherein
the second processor is further configured to calculate the second variation of the heater power due to the accumulated film thickness change by using a model, in which a temperature variation is associated with a film thickness variation, and using an accumulated film thickness versus power table in which an accumulated film thickness variation is associated with a heater power variation.

2. The system according to claim 1, wherein the second processor is configured to calculate the first variation of the heater power due to the preset temperature change by using the temperature correction value and using a temperature versus power table in which a temperature variation is associated with a heater power variation, the temperature correction value being used in the deposition process and being associated with the accumulated film thickness.

3. The system according to claim 2,
wherein the semiconductor manufacturing apparatus includes a reaction tube that is divided into zones,
wherein the temperature versus power table has a column for heater power variations for each of the zones, and a row for heater power variations for each of the zones, the temperature versus power table further including a temperature correction table having a temperature correction value for each of the zones, and
wherein the second processor is configured to calculate, for each of the zones, the first variation of the heater power due to the preset temperature change, by adding values in a row direction of the temperature versus power table for each of the zones, the values being obtained by multiplying the heater power variations in the column by the temperature correction value.

4. The system according to claim 1,
wherein the semiconductor manufacturing apparatus includes a reaction tube that is divided into zones,
wherein the model has a film thickness variation for each of the zones, and the accumulated film thickness versus power table has a heater power variation for each of the zones, the heater power variation being associated with the accumulated film thickness, and
wherein the second processor is configured to calculate, for each of the zones, the second variation of the heater power due to the accumulated film thickness change by multiplying the heater power variation by the film thickness variation for each of the zones.

5. The system according to claim 1, wherein the second processor is configured to predict the second heater power on a per-zone basis and on a per-accumulated-film-thickness basis.

6. A temperature correction information calculating method performed by a temperature correction information calculating device for use with a semiconductor manufacturing apparatus, the temperature correction information calculating method comprising:
correcting a preset temperature in accordance with an accumulated film thickness on an inner wall of the semiconductor manufacturing apparatus;
controlling a temperature by using a heater such that the temperature approaches the corrected preset temperature in the semiconductor manufacturing apparatus to perform a deposition process on an object;
obtaining first heater power applied to the heater, the first heater power being included in log information that is generated when the deposition process is performed;
predicting second heater power by adding, to the first heater power, a first variation of heater power due to a preset temperature change and a second variation of heater power due to an accumulated film thickness change; and
correcting a temperature correction value based on the predicted second heater power, the temperature correction value being stored in a memory, wherein the second variation of the heater power due to the accumulated film thickness change is calculated by using a model, in which a temperature variation is associated with a film thickness variation, and using an accumulated film thickness versus power table in which an accumulated film thickness variation is associated with a heater power variation.

7. A non-transitory recording medium storing a program for causing a temperature correction information calculating device for use with a semiconductor manufacturing apparatus to execute a process, the process comprising:

correcting a preset temperature in accordance with an accumulated film thickness on an inner wall of the semiconductor manufacturing apparatus;

controlling a temperature by using a heater such that the temperature approaches the corrected preset temperature in the semiconductor manufacturing apparatus to perform a deposition process on an object;

obtaining first heater power applied to the heater, the first heater power being included in log information that is generated when the deposition process is performed;

predicting second heater power by adding, to the first heater power, a first variation of heater power due to a preset temperature change and a second variation of heater power due to an accumulated film thickness change; and correcting a temperature correction value based on the predicted second heater power, the temperature correction value being stored in a memory, wherein the second variation of the heater power due to the accumulated film thickness change is calculated by using a model, in which a temperature variation is associated with a film thickness variation, and using an accumulated film thickness versus power table in which an accumulated film thickness variation is associated with a heater power variation.

* * * * *